United States Patent [19]
Haller et al.

[11] Patent Number: 5,357,403
[45] Date of Patent: Oct. 18, 1994

[54] ADAPTIVE LITHOGRAPHY IN A HIGH DENSITY INTERCONNECT STRUCTURE WHOSE SIGNAL LAYERS HAVE FIXED PATTERNS

[75] Inventors: Theodore R. Haller, Scotia; Robert J. Wojnarowski, Ballston Lake, both of N.Y.

[73] Assignee: General Electric Company, Schenectady, N.Y.

[21] Appl. No.: 545,793

[22] Filed: Jun. 29, 1990

[51] Int. Cl.⁵ ............................................. H05K 1/11
[52] U.S. Cl. ................................. 361/794; 174/255; 257/724; 361/792; 361/795
[58] Field of Search .............. 174/250, 251, 254, 255, 174/260; 357/45, 54, 65, 71, 80; 361/386, 397, 400, 403, 412, 414, 792–795; 439/43–48, 65, 69, 74; 257/700, 723, 724, 778

[56] References Cited

U.S. PATENT DOCUMENTS

| | | | |
|---|---|---|---|
| 3,705,332 | 12/1972 | Parks | 174/35 |
| 4,349,862 | 9/1982 | Bajorek et al. | 361/401 |
| 4,628,406 | 12/1986 | Smith et al. | 361/386 |
| 4,641,425 | 2/1987 | Dubuisson et al. | 174/255 |
| 4,665,468 | 5/1987 | Dohya | 361/414 |
| 4,874,721 | 10/1989 | Kimura et al. | 361/412 |
| 4,954,878 | 9/1990 | Fox et al. | 357/70 |

FOREIGN PATENT DOCUMENTS 0276004  7/1988  European Pat. Off. ............ 361/414

OTHER PUBLICATIONS

IBM Disclosure Bulletin "Photo—Defined Lamination For Chip Bonding" by J. C. Edwards vol. 25 No. 4 Sep. 1982.
IBM Disclosure Bulletin "Low Inductance Decoupling Capacitor Connection" vol. 28 No. 7 Dec. 1985.

*Primary Examiner*—Leo P. Picard
*Assistant Examiner*—Donald Sparks
*Attorney, Agent, or Firm*—Geoffrey H. Krauss; Marvin Snyder

[57] ABSTRACT

Mispositioning of chips in a high density interconnect structure is compensated for by including a layer having alignment conductor in the high density interconnect structure without requiring adaptation of the signal conductor metallization levels of the high density interconnect structure. One level, two levels or more of alignment conductor may be employed. The alignment levels of the high density interconnect structure are preferably a ground plane, and if two layers of alignment conductors are provided, a power plane.

3 Claims, 6 Drawing Sheets

ADAPTIVE LITHOGRAPHY IN A HIGH DENSITY INTERCONNECT STRUCTURE WHOSE SIGNAL LAYERS HAVE FIXED PATTERNS

RELATED APPLICATIONS

This application relates to U.S. Pat. No. 4,835,704, entitled, "An Adaptive Lithography System to Provide High Density Interconnect" by C. W. Eichelberger et al., U.S. patent application Ser. No. 361,623, filed Jun. 5, 1989, entitled, "Adaptive Lithography Accommodation of Tolerances in Chip Positioning in High Density Interconnect Structures", by T. R. Haller, and patent application Ser. No. 07/457,023, filed Dec. 26, 1989, entitled, "Locally Orientation Specific Routing System", by T. R. Haller et al., each of which is incorporated herein by reference in its entirety.

BACKGROUND OF THE INVENTION

1. Field of the Invention

The present invention relates to the field of high density interconnect structures, and more particularly, to accommodation of chip placement tolerances in such systems.

2. Background Information

A high density interconnect (HDI) structure or system which has been developed by General Electric Company offers many advantages in the compact assembly of electronic systems. For example, an electronic system such as a micro computer which incorporates 30-50 chips can be fully assembled and interconnected on a single substrate which is 2 inch long by 2 inch wide by 0.050 inch thick. Even more important, this interconnect structure can be disassembled for repair or replacement of a faulty component and then reassembled without significant risk to the good components incorporated within the system. This is particularly important where as many as 50 chips having a cost of as much as $2,000.00, each, may be incorporated in a single system on one substrate. This repairability is a substantial advance over prior connection systems in which reworking the system to replace damaged components was either impossible or involved substantial risk to the good components.

Briefly, in this high density interconnect structure, a ceramic substrate such as alumina which may be 100 mils thick and of appropriate size and strength for the overall system, is provided. This size is typically less than 2 inches square, but may be made larger or smaller. Once the position of the various chips has been specified, individual cavities or one large cavity having appropriate depth at the intended locations of differing chips, is prepared. This may be done by starting with a bare substrate having a uniform thickness and the desired size. Conventional, ultrasonic or laser milling may be used to form the cavities in which the various chips and other components will be positioned. For many systems where it is desired to place chips nearly edge-to-edge, a single large cavity is satisfactory. That large cavity may typically have a uniform depth where the semiconductor chips have a substantially uniform thickness. Where a particularly thick or a particularly thin component will be placed, the cavity bottom may be made respectively deeper or shallower to place the upper surface of the corresponding component in substantially the same plane as the upper surface of the rest of the components and the portion of the substrate which surrounds the cavity. The bottom of the cavity is then provided with a thermoplastic adhesive layer which may preferably be polyetherimide resin available under the trade name ULTEM ® 6000 from the General Electric Company. The various components are then placed in their desired locations within the cavity, the entire structure is heated to about 300° C. which is above the softening point of the ULTEM ® polyetherimide (which is in the vicinity of 235° C.) and then cooled to thermoplastically bond the individual components to the substrate. Thereafter, a polyimide film which may be Kapton ® polyimide, available from E. I. du Pont de Nemours Company, which is ≈0.0005-0.003 inch (≈12.5-75 microns) thick is pretreated to promote adhesion by reactive ion etching (RIE), the substrate and chips are then coated with ULTEM ® 1000 polyetherimide resin or another thermoplastic and the Kapton film is laminated across the top of the chips, any other components and the substrate with the ULTEM ® resin serving as a thermoplastic adhesive to hold the Kapton ® in place. Thereafter, via holes are provided (preferably by laser drilling) in the Kapton ® and ULTEM ® layers in alignment with the contact pads on the electronic components to which it is desired to make contact. A metallization layer which is deposited over the Kapton ® layer extends into the via holes and makes electrical contact to the contact pads disposed thereunder. This metallization layer may be patterned to form individual conductors during the process of depositing it or may be deposited as a continuous layer and then patterned using photoresist and etching. The photoresist is preferably exposed using a laser to provide an accurately aligned conductor pattern at the end of the process. Alternatively, exposure through a mask may be used.

Additional dielectric and metallization layers are provided as required in order to provide all of the desired electrical connections among the chips. Any misposition of the individual electronic components and their contact pads is compensated for by an adaptive laser lithography system which is the subject of some of the Patents and Applications which are listed hereinafter.

In this manner, the entire interconnect structure can be fabricated from start to finish (after definition of the required conductor patterns and receipt of the electronic components) in as little as ≈8-12 hours.

This high density interconnect structure provides many advantages. Included among these are the lightest weight and smallest volume packaging of such an electronic system presently available. A further, and possibly more significant advantage of this high density interconnect structure, is the short time required to design and fabricate a system using this high density interconnect structure. Prior art processes require the prepackaging of each semiconductor chip, the design of a multilayer circuit board to interconnect the various packaged chips, and so forth. Multilayer circuit boards are expensive and require substantial lead time for their fabrication. In contrast, the only thing which must be specially pre-fabricated for the HDI system is the substrate on which the individual semiconductor chips will be mounted. This substrate is a standard stock item, other than the requirement that the substrate have appropriate cavities therein for the placement of the semiconductor chips so that the interconnect surface of the various chips and the substrate will be in a single plane. In the HDI process, the required cavities may be formed in an already fired ceramic substrate by conventional or laser milling. This milling process is straightforward and fairly rapid with the result that once a desired configuration for the substrate has been established, a corresponding physical substrate can be made ready for the mounting of the semiconductor chips in as little as 1 day and typically 4 hours for small quantities as are suitable for research or prototype systems to confirm the design prior to quantity production.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure, methods of fabricating it and tools for fabricating it are disclosed in U.S. Pat. No. 4,783 695, entitled "Multichip Integrated Circuit Packaging Configuration and Method" by C. W. Eichelberger, et al.; U.S. Pat. No. 4,835,704, entitled "Adaptive Lithography System to Provide High Density Interconnect" by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger, et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski, et al.; U.S. patent application Ser. No. 310,149, filed Feb. 14, 1989, entitled "Laser Beam Scanning Method for Forming Via Holes in Polymer Materials" by C. W. Eichelberger, et al.; U.S. patent application Ser. No. 312,798, filed Feb. 21, 1989, entitled "High Density Interconnect Thermoplastic Die Attach Material and Solvent Die Attachment Processing" by R. J. Wojnarowski, et al.; U.S. patent application Ser. No. 283,095, filed Dec. 12, 1988, entitled "Simplified Method for Repair of High Density Interconnect Circuits" by C. W. Eichelberger, et al.; U.S. patent application Ser. No. 305,314, filed Feb. 3, 1989, entitled "Fabrication Process and Integrated Circuit Test Structure" by H. S. Cole, et al.; U.S. patent application Ser. No. 250,010, filed Sep. 27, 1988, entitled "High Density Interconnect With High Volumetric Efficiency" by C. W. Eichelberger, et al.; U.S. patent application Ser. No. 329,478, filed Mar. 28, 1989, entitled "Die Attachment Method for Use in High Density Interconnected Assemblies" by R. J. Wojnarowski, et al.; U.S. patent application Ser. No. 253,020, filed Oct. 4, 1988, entitled "Laser Interconnect Process" by H. S. Cole, et al.; U.S. patent application Ser. No. 230,654, filed Aug. 5, 1988, entitled "Method and Configuration for Testing Electronic Circuits and Integrated Circuit Chips Using a Removable Overlay Layer" by C. W. Eichelberger, et al.; U.S. patent application Ser. No. 233,965, filed Aug. 8, 1988, entitled "Direct Deposition of Metal Patterns for Use in Integrated Circuit Devices" by Y. S. Liu, et al.; U.S. patent application Ser. No. 237,638, filed Aug. 23, 1988, entitled "Method for Photopatterning Metallization Via UV Laser Ablation of the Activator" by Y. S. Liu, et al.; U.S. patent application Ser. No. 237,685, filed Aug. 25, 1988, entitled "Direct Writing of Refractory Metal Lines for Use in Integrated Circuit Devices" by Y. S. Liu, et al.; U.S. patent application Ser. No. 240,367, filed Aug. 30, 1988, entitled "Method and Apparatus for Packaging Integrated Circuit Chips Employing a Polymer Film Overlay Layer" by C. W. Eichelberger, et al.; U.S. patent application Ser. No. 342,153, filed Apr. 24, 1989, entitled "Method of Processing Siloxane-Polyimides for Electronic Packaging Applications" by H. S. Cole, et al.; U.S. patent application Ser. No. 289,944, filed Dec. 27, 1988, entitled "Selective Electrolytic Deposition on Conductive and Non-Conductive Substrates" by Y. S. Liu, et al.; U.S. patent application Ser. No. 312,536, filed Feb. 17, 1989, entitled "Method of Bonding a Thermoset Film to a Thermoplastic Material to Form a Bondable Laminate" by R. J. Wojnarowski; U.S. patent application Ser. No. 363,646, filed Jun. 8, 1989, entitled "Integrated Circuit Packaging Configuration for Rapid Customized Design and Unique Test Capability" by C. W. Eichelberger, et al.; U.S. patent application Ser. No. 07/459,844, filed Jan. 2, 1990, entitled "Area-Selective Metallization Process" by H. S. Cole, et al.; U.S. patent application Ser. No. 361,623, filed Jun. 5, 1989, entitled, "Adaptive Lithography Accommodation of Tolerances and Chip Positioning in High Density Interconnect Structures", by T. R. Haller; U.S. patent application Ser. No. 07/457,023, filed Dec. 26, 1989, entitled "Locally Orientation Specific Routing System" by T. R. Haller, et al.; U.S. patent application Ser. No. 456,421, filed Dec. 26, 1989, entitled "Laser Ablatable Polymer Dielectrics and Methods" by H. S. Cole, et al.; U.S. patent application Ser. No. 454,546, filed Dec. 21, 1989, entitled "Hermetic High Density Interconnected Electronic System" by W. P. Kornrumpf, et al.; U.S. patent application Ser. No. 07/457,127, filed Dec. 26, 1989, entitled "Enhanced Fluorescence Polymers and Interconnect Structures Using Them" by H. S. Cole, et al.; U.S. patent application Ser. No. 454,545, filed Dec. 21, 1989, entitled "An Epoxy/Polyimide Copolymer Blend Dielectric and Layered Circuits Incorporating It" by C. W. Eichelberger, et al.; application Ser. No. 07/504,760, filed Apr. 5, 1990, entitled, "A Building Block Approach to Microwave Modules", by W. P. Kornrumpf et al.; application Ser. No. 07/504,821, filed Apr. 5, 1990, entitled, "HDI Microwave Circuit Assembly", by W. P. Kornrumpf, et al.; application Ser. No. 07/504,750 filed Apr. 5, 1990, entitled, "An Ultrasonic Array With a High Density of Electrical Connections", by L. S. Smith, et al.; application Ser. No. 07/504,803, filed Apr. 5, 1990, entitled, "Microwave Component Test Method and Apparatus", by W. P. Kornrumpf, et al.; application Ser. No. 07/504,753, filed Apr. 5, 1990, entitled, "A Compact High Density Interconnected Microwave System", by W. P. Kornrumpf; application Ser. No. 07/504,769, filed Apr. 5, 1990, entitled, "A Flexible High Density Interconnect Structure and Flexibly Interconnected System" by C. W. Eichelberger, et al.; application Ser. No. 07/504,751, filed Apr. 5, 1990, entitled, "Compact, Thermally Efficient Focal Plane Array and Testing and Repair Thereof", by W. P. Kornrumpf, et al; application Ser. No. 07/504,749, filed Apr. 5, 1990, entitled, "High Density Interconnect Structure with Top Mounted Components", by R. J. Wojnarowski, et al.; application Ser. No. 07/504,770, filed Apr. 5, 1990, entitled, "A High Density Interconnect Structure Including a Chamber", by R. J. Wojnarowski, et al.; and application Ser. No. 07/504,748, filed Apr. 5, 1990, entitled, "Microwave Component Having Tailored Operating Characteristics and Method of Tailoring" by W. P. Kornrumpf, et al. Each of these Patents and Patent Applications is incorporated herein by reference.

This high density interconnect system is now being used for the interconnection of fairly complex systems including 40 to 60 chips which are interconnected by 1500 to 3000 nodes with the result that a computerized router typically requires relatively long runs (of from 10 to 24 hours) to successfully route all the interconnections and, in some cases, is unable to route some of the interconnections when using only two signal layers.

In a high density interconnect system of the general type discussed above, the pattern of each metallization layer and the via holes in each dielectric layer must either be individually tailored to the exact positions of the various integrated circuit chips (as placed) or an adaptive lithography system must adjust an ideal metallization and via hole pattern in accordance with the actual position of the various integrated circuit chips. In the above-identified related U.S. Pat. No. 4,835,704, this problem is solved by adaptation of an ideal metallization pattern in accordance with the actual location of each of the integrated circuits chips and its contact pads by modifying the metallization pattern to properly connect to those contact pads in their actual positions. That adaptation is enabled by providing a "picture frame" around the allowed location of each integrated circuit chip in which adaptation of the metal layer takes place. In order to facilitate that adaptation, one of the design rules for the ideal metallization is that each metal path which crosses a picture frame must do so perpendicular to those sides of that picture frame which it crosses. The ideal metallization pattern over each chip is maintained with respect to the chip and thus, must be shifted and/or rotated with respect to the portion of the metallization pattern outside the picture frame in accordance with any shift and/or rotation of the chip with respect to its ideal location. The ideal metallization pattern outside the outer edges of the picture frames is maintained with respect to the substrate, i.e. unchanged during the adaptation process. Adaptation to the actual location of each chip is accomplished by modifying the metallization pattern within the picture frame area for that chip to properly connect from the ideal metallization pattern at the outside edge of that picture frame to the shifted/rotated ideal metallization pattern over that chip. This results in the angling of conductors within its picture frame when the chip is displaced perpendicular to, or rotated with respect to its ideal position relative to a side of the picture frame.

The above-identified application Ser. No. 361,623 entitled "Adaptive Lithography Accommodation of Tolerances in Chip Positioning in High Density Interconnect Structures" provides accommodation for chip positioning placement tolerances by including contact islands in the signal layers of the high density interconnect structure where via connections are to be made to contact pads, with the contact islands being large enough to ensure that as long as the chips are placed within normal tolerances, each contact island in the signal layer will overlap its associated contact pad on the chip by a sufficient amount to enable a via hole to be positioned where it overlaps the contact pad and is, in turn, overlapped by contact island in the signal layer. While this is effective, it has the disadvantage where a high density of interconnections is required of including in the signal layer relatively large contact islands (typically 4 mils square (~100 microns square) for 4 mil contact pads on 8 mil centers) whereas the conductor runs themselves are only 1.5 mils wide (~40 microns wide) and in the U.S. Pat. No. 4,835,704 technique, would require only a 2 mil square cover pad centered over the via. This technique accommodates a maximum tolerance on chip placement of ±2 mils when a 2 mil by 2 mil overlap is required at a via. For larger placement tolerances, the contact islands can be made 6 mils square, but then signal conductors cannot run between adjacent contact islands.

As a consequence of the presence of these large contact islands, conductor runs in the signal layers must be spaced further apart than would otherwise be necessary in order to maintain design rule clearances between contact islands and adjacent signal runs. To ensure proper coverage of via holes between properly aligned conductors, it is presently preferred to include a cover pad in a signal conductor at the location of such a via hole, that cover pad is only 2 mils square (~50 microns square) and thus has a much smaller effect on wiring density than the contact islands of application Ser. No. 361,623 have. Application Ser. No. 361,623 discusses in its discussion of its FIG. 10, the placement of its contact islands in a different conductor layer when the contact islands must be made large enough that they prevent the placement of another conductor between adjacent contact islands.

Application Ser. No. 07/457,023 entitled "Locally Orientation Specific Routing System" reduces the restrictions on the placement of signal conductors by the routing program by allowing conductors to run both vertically and horizontally in each layer of the high density interconnect structure except in restricted areas in the vicinity of the edges of chips. In the vicinity of the edges of chips, conductors in every layer are restricted to running perpendicular to that edge of the chip in order to allow for the changes in orientation of the conductors in that portion of the routing plane which are produced in accordance with U.S. Pat. No. 4,835,704 when a chip is displaced from its ideal location.

As this high density interconnect structure system has matured, increased attention has been directed to its use in relatively large quantity production of complex systems which require several signal layers for their interconnection. Where adaptation is required in every conductor layer of a high density interconnect structure, the conductor pattern of each layer is individually written by a laser. Consequently, in production environment, throughput can be laser limited with a consequent requirement for multiple lasers.

Consequently, there is a need for an improved technique for accommodating chip placement tolerances in a high density interconnect structure.

OBJECTS OF THE INVENTION

Accordingly, a primary object of the present invention is to accommodate tolerances in chip placement in a high density interconnect structure in a manner which places no restrictions on either the signal conductor layers or the routing system.

Another object of the present invention is to avoid any adaptation of the signal conductor layers of a high density interconnect structure in accommodating chip placement tolerances.

Another object of the present invention is to provide full accommodation for chip placement tolerances in a first, non-signal conductor layer of a high density interconnect structure.

Another object of the present invention is to accommodate chip placement tolerances in a ground plane layer and a power plane layer of high density interconnect structures which include such layers.

Another object of the present invention is to permit routing of increasing complexity structures without requiring excessive routing time.

SUMMARY OF THE INVENTION

The above and other objects which will become apparent from the specification as a whole, including the drawings, are accomplished in accordance with the present invention by providing a pattern of alignment conductors in the first conductor layer of a high density interconnect structure with the position of the alignment conductors being adapted to the actual chip placement, if necessary. One alignment conductor is associated with each contact pad which is to be connected to the high density interconnect structure. Depending on the amount of misplacement of a chip from its ideal position, that misplacement may be compensated for merely by adjusting the placement of the via hole which connects the overlying signal conductor to that alignment conductor or the alignment conductor's position may also to be adapted in order to position the alignment conductor where that via hole can properly overlap that alignment conductor and be properly overlapped by that signal conductor. This alignment conductor layer of the high density interconnect structure may preferably be a ground plane in order to provide shielding between the chips and the overlying signal conductors, and to provide the low voltage drops necessary in order for the system to operate at its maximum possible speed and in order to avoid "wasting" a conductor layer of the high density interconnect structure by dedicating it exclusively to alignment conductors.

Greater accommodation can be provided by providing alignment conductors in the first two conductive layers of the high density interconnect structure. For presently employed chip contact pad sizes and spacings, two layers of alignment conductors should be sufficient to accommodate all acceptable placement tolerances. However, more layers of alignment conductors may be employed, if necessary.

The alignment conductors serve to provide, for every chip connection, a conductor connected to the chip contact pad which is positioned where the first signal layer via hole, when properly positioned with respect to a fixed, non-adapted signal conductor pattern, will be aligned over that conductor. As a result, the signal conductor layer has a fixed pattern which is merely aligned with a fixed pattern of via holes which expose those conductors. This enables the signal layer and the via holes for them to be patterned without any adaptation. These layers may be patterned using pre-fabricated standard masks.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
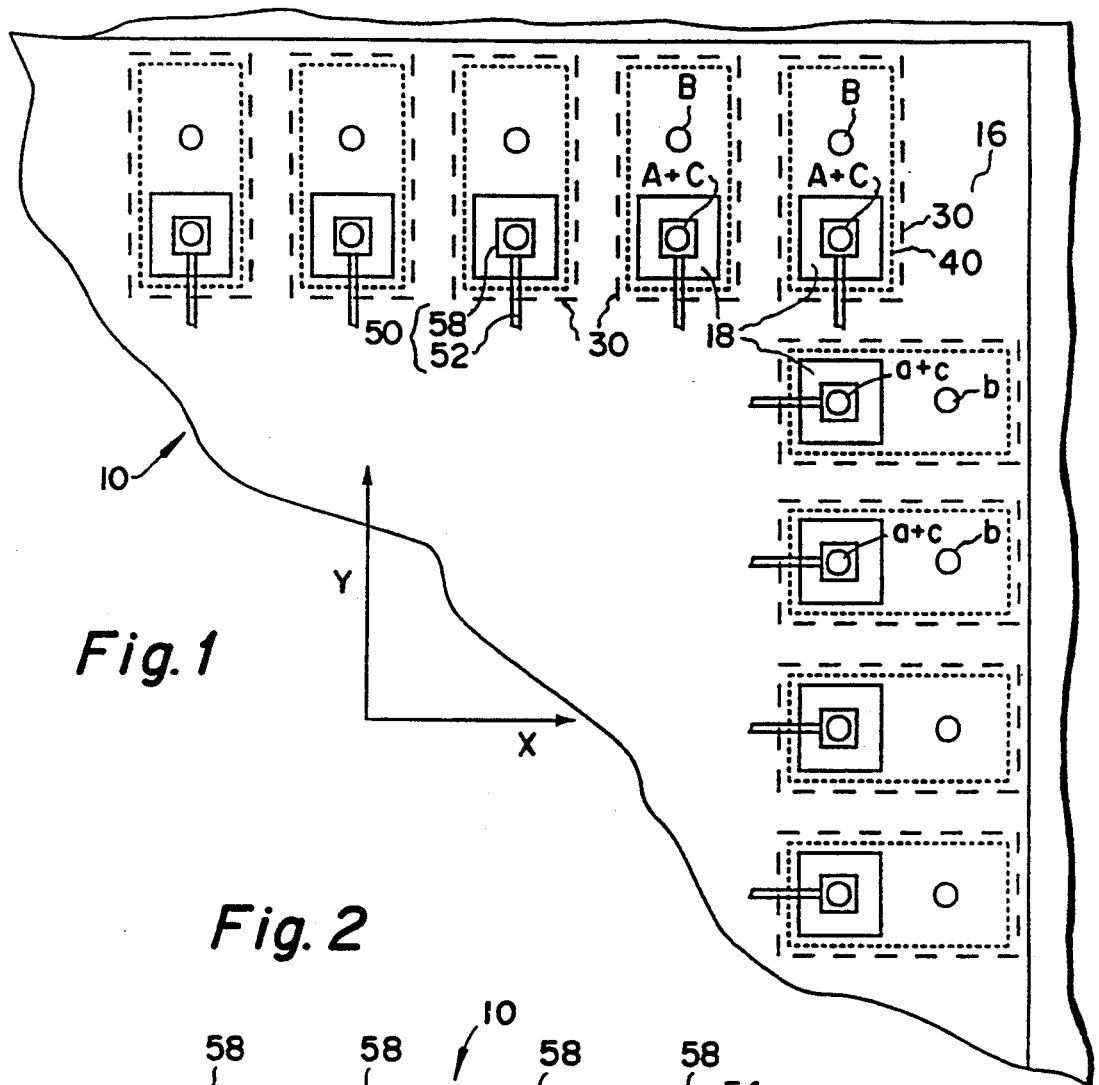
FIG. 1 is a plan view illustration and FIG. 2 is a cross-section illustration of a high density interconnect structure in accordance with the present invention employing two layers of alignment conductors in a situation where the chip is positioned in its ideal location with respect to a first signal conductor layer.
Figure 2:
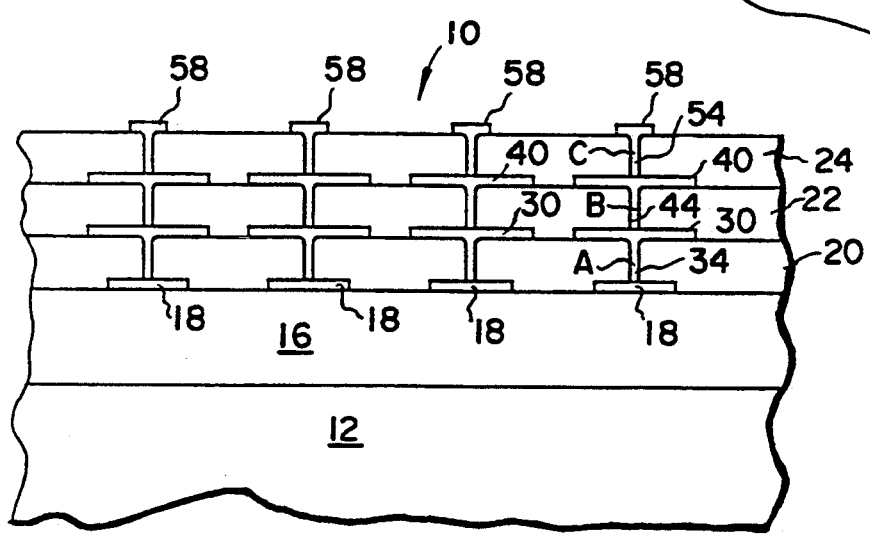

In FIG. 1, a portion of a high density interconnect structure 10 is illustrated in plan view. The illustrated portion includes a corner of a chip 16 having square chip contact pads 18 along two sides of the chip. Disposed over the chip and its contact pads, as is shown more clearly in the cross-section in FIG. 2, are a series of dielectric layers 20, 22 and 24, two layers of alignment conductors 30 and 40 and a layer of signal conductors 50. A signal conductor 50 comprises a conductive run or trace 52 and an enlarged cover pad 58 where it connects to a conductor in a lower level through a via hole. Alignment conductors 30 and 40 may also be referred to as alignment correction conductors since their positions can be shifted to provide a connection path between a cover pad 58 and its associated contact pad when the cover pad and the contact pad are offset or otherwise disposed out of ideal alignment. In the plan view in FIG. 1, the first level alignment conductors 30 are indicated by a dashed line outline so that they may be distinguished from the underlying contact pads which are shown in solid outline and the overlying conductors. The second level alignment conductors 40 are illustrated in a dotted outline in the plan view in FIG. 1 and the signal conductors are illustrated in a solid outline since their small dimensions makes them distinguishable from the underlying solid outline of the contact pads. In FIG. 1, the signal conductor pattern and the contact pad pattern are illustrated in their ideal alignment in which the cover pads 58 of the signal conductors are centered over the contact pads 18. For a typical semiconductor chip having 4 mils square contact pads disposed on 8 mils centers, the alignment conductors 30 and 40 are preferably 6 mils by 12 mils, that is one and one-half times the length of a side of a contact pad by three times the length of a side of a contact pad. Naturally, other sizes and configurations may be used. In the illustrated ideal alignment, the alignment conductors 30 and 40 are disposed in alignment with each other. Conductors 40 are drawn slightly smaller than conductors 30 in order that the boundaries of each will be visible in the figures. Preferably conductors 30 and 40 are the same size in an actual structure.

FIG. 2 is a stylized, cross-section of the FIG. 1 structure through the row of contact pads 18 along the top of FIG. 1. FIG. 2 includes a portion of the high density interconnect structure substrate 12 on which the chips 16 are disposed, at least during high density interconnect structure fabrication. No section line is shown in FIG. 1 because the section is taken in different places for different conductor layers. Each conductor's cross-section is taken in the plane of the via which connects it to next lower conductor in order to clearly illustrate the manner in which the contact pad 18 of the chip is connected by its associated first and second alignment conductors (30 and 40, respectively) to its associated signal conductor 50. The via portion of the signal conductor which extends downward from the cover pad 58 is identified by the reference numeral 54. The via portion of the alignment conductors 30 and 40 are identified by the reference numerals 34 and 44, respectively. In the FIG. 1 structure, the via holes may be directly stacked, if such stacking is permitted by design rules. We prefer to space them apart as indicated in the plan view in FIG. 1 where each circle represents one or more vias located at that point in plan view. The vias in the first layer of dielectric material (which are part of the first conductor layer and thus the alignment conductors 30) are identified in the plan view by a capital "A". The vias in the second layer of dielectric material (which are part of the second conductor layer and thus the alignment conductors 40) are identified in the plan view by a capital "B". The vias in the third layer of dielectric material (which are part of the third conductor layer and thus the cover pads 58) are identified in the plan view by a capital "C". Thus, the circles labeled "A+C" indicate the location in plan view of a via 34 and a via 54 which are vertically aligned, although not directly connected. The circles labeled "B" indicate the location in plan view of a via 44. These letter designations are used for the vias associated with the right-most contact pad 18 in FIG. 2. The displacement of the via B from the vias A and C avoids the creation of dimples in the high density interconnect structure which can occur if two vias in adjacent layers are stacked one on top of another. In the situation illustrated, dielectric layer 22 fills in any depression in the first layer via 34 (A) thereby providing a planar surface for the metallization 40 to which the via 54 (C).

In each of the plan view figures, the alignment conductor pattern along the vertical portion of the chip edge is illustrated, but not discussed in detail herein since the manner of overlap and connection should be apparent from the discussion of the connections along the horizontal edge of the chip which are discussed in more detail. Along the vertical edge of the chip, vias in the first layer of dielectric material are identified by a lower case "a", the vias in the second layer of dielectric material are identified by a lower case "b", the vias in the third layer of dielectric material are identified by a lower case "c". This is to prevent confusion between vias associated with side contact pads and vias associated with top contact pads in the vicinity of the corner of the chip 16.

It should be understood that the structure illustrated in FIG. 1 is only a small portion of a much larger, multi-chip system which is interconnected by the high density interconnect structure 10, a portion of which is illustrated in FIG. 1. The actual placement of each of the chips in that larger system will be in its own unique position with its own deviation from the ideal desired position for that chip. As a consequence, the ideal alignment between cover pads of the signal layer and the contact pads of the chip will not be present at most of the chips in the structure and may not be present at any of the chips in the structure. The position of the signal conductor layer relative to the contact pads of any particular chip 16 is determined by an overall best fit alignment of the signal conductor pattern to the actual position of every chip involved in the structure. This position of the signal layer may be in its ideal position relative to the substrate on which the individual chips are disposed or may have some other position. However, for each chip, that chip will have some particular displacement from its ideal position relative to the overlying signal conductor pattern. For clarity in the following discussions, the displacement between the chip's contact pads 18 and the cover pads 58 of the signal conductor layer are phrased in terms of the displacement of the chip contact pads relative to the signal conductor layer. This is because the signal conductor layer extends across the whole structure and thus serves as a single common reference with respect to which all displacements can be expressed.

In determining the appropriate positions in which to place the first and second alignment conductors 30 and 40 for each contact pad or chip, the position in which the signal layer will be placed is first determined. Then, positions are selected for the first and second alignment conductors in which the first alignment conductor 30 overlaps a contact pad 18 by a sufficient amount for a via connection to be formed between that alignment conductor and that contact pad. In a similar fashion, a position for the second alignment conductor 40 is selected which provides sufficient overlap between it and the first alignment conductor 30 to allow a via hole connecting them to be properly positioned in that overlap, while at the same time, positioning that second alignment conductor 40 in a position where the signal conductor cover pad 58, which is to be connected to the contact pad in question, is disposed completely over the second alignment conductor such that it can be connected thereto by a proper via. Thus, the specific locations for the alignment conductors are adapted in accordance with actual chip placement and are determined based on the known, but not yet placed position of the signal conductor layer and the known and already placed, actual positions of the chip's contact pads.

Figure 3:
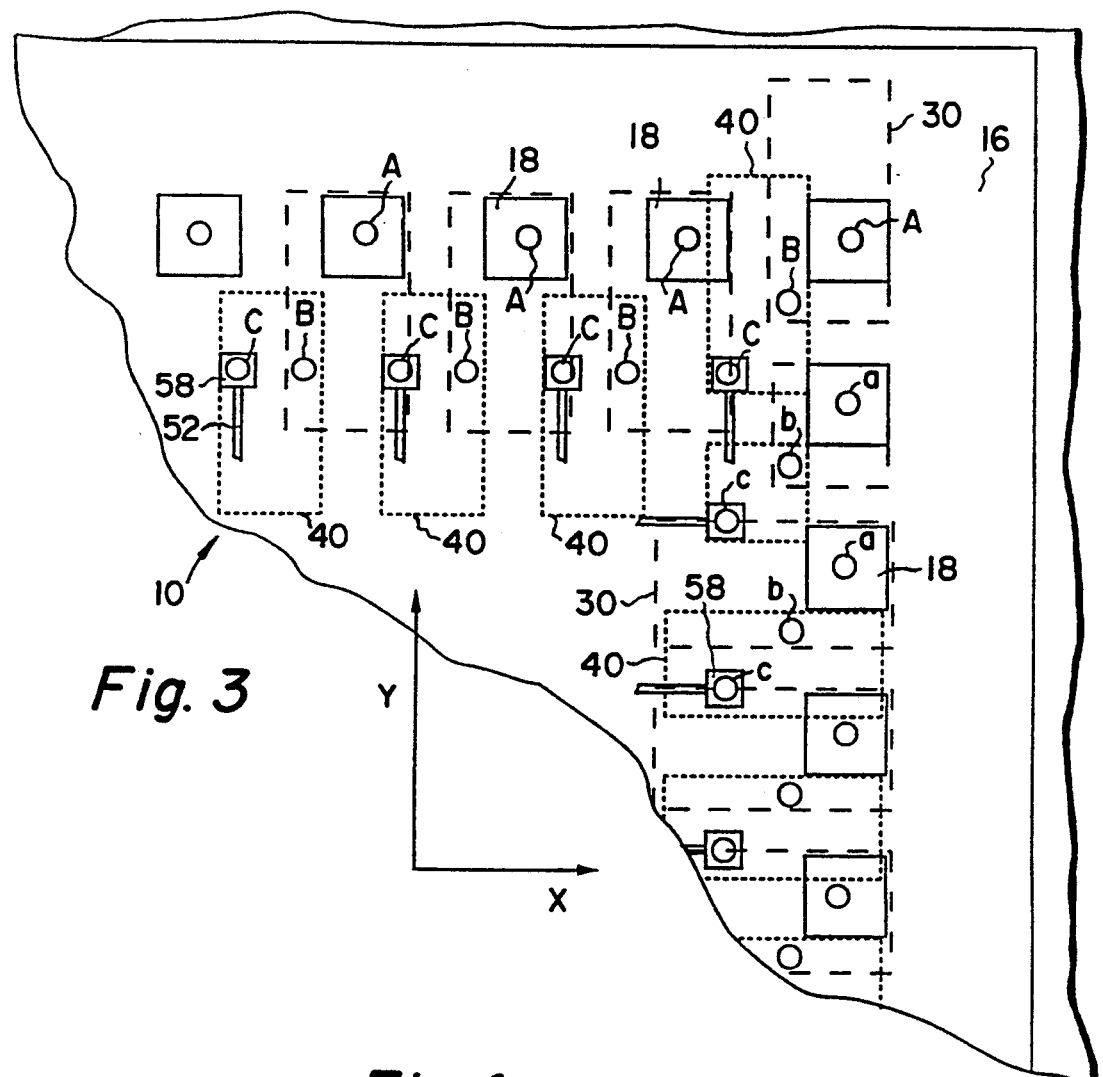
FIGS. 3 and 4 are similar views to FIGS. 1 and 2 of a two level alignment conductor structure in which the contact pads on the chip are displaced relative to the signal conductor pattern by the maximum distance which permits the first layer alignment conductor to fully overlap the chip contact pad.
Figure 4:
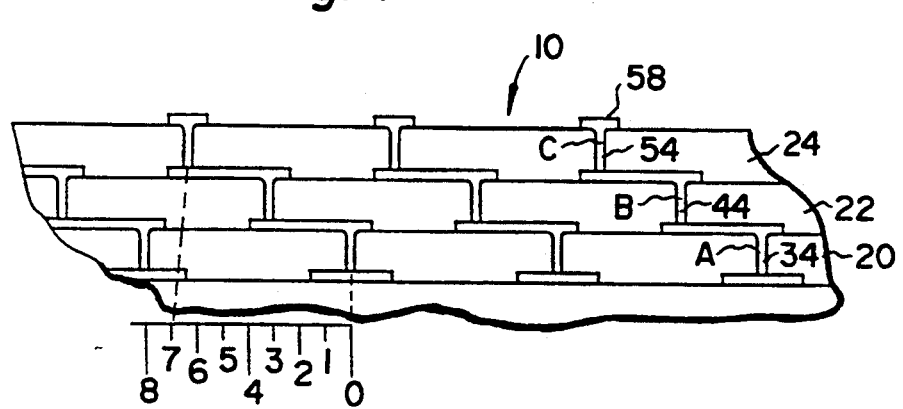

FIGS. 3 and 4 illustrate a situation in which the contact pads 18 are displaced relative to the cover pads 58 of the signal conductors by +7 mils in the X-direction and +7 mils in the Y-direction. In this configuration, the lower alignment conductors 30 (away from the corner) are shifted relative to the contact pads 18 to place the contact pads 18, which are disposed along the top of the chip, so that they are just completely overlapped by the upper right-hand corner of the first level alignment conductors 30. The second level alignment conductors 40 are displaced downward to the left so that they provide a 2 mil overlap in the X-direction with the alignment conductors 30, as shown in FIG. 3. Alternatively, the alignment conductors 40 could be positioned at the same Y-direction position as the alignment conductor 30. Each alignment conductor 40 is just fully overlapped by the cover pad 58 of its associated signal conductor 50 at the left-hand side of the alignment conductor 40. The first level via connections are centered in the contact pads 18 as indicated by the circles A. The second level vias between the first and second alignment conductors are centered in their overlap in the X-direction as indicated by the circles B. The third level vias between the signal conductor cover pads 58 and the second alignment conductors 40 are centered in the cover pads 58 as indicated by the circles C.

The manner in which the contact pads 18 are connected to the cover pads 58 by the alignment conductors 30 and 40 is illustrated in cross-section in FIG. 4 in a manner similar to the FIG. 2 illustration. Again, the cross-section is taken at each metallization level in the plane of its via connected to the next lower level. It will be noted from this configuration that if there were no Y-direction displacement of the contact pads relative to the signal conductors, then each of the signal conductor cover pads 58 would be disposed directly over the contact pad 18 which is adjacent to its associated contact pad. This two level alignment conductor system can handle such a displacement without any shorting of contact pads, as is apparent from FIG. 4. However, this situation could not be handled by a single level of alignment conductors without violating design rules.

Along the lower left-hand portion of FIG. 4, a scale is provided indicating the distance by which the center of the left-most signal conductor cover pad 58 is displaced from the center of its associated chip contact pad 18. In this configuration, that distance is 7 mils. This is the maximum displacement which can be handled using rectangular alignment conductors of the sizes indicated while still having the first level alignment conductors 30 fully overlapping the chip contact pads 18 as may be considered desirable to ensure that the first level via holes do not extend off the contact pads 18.

Figure 5:
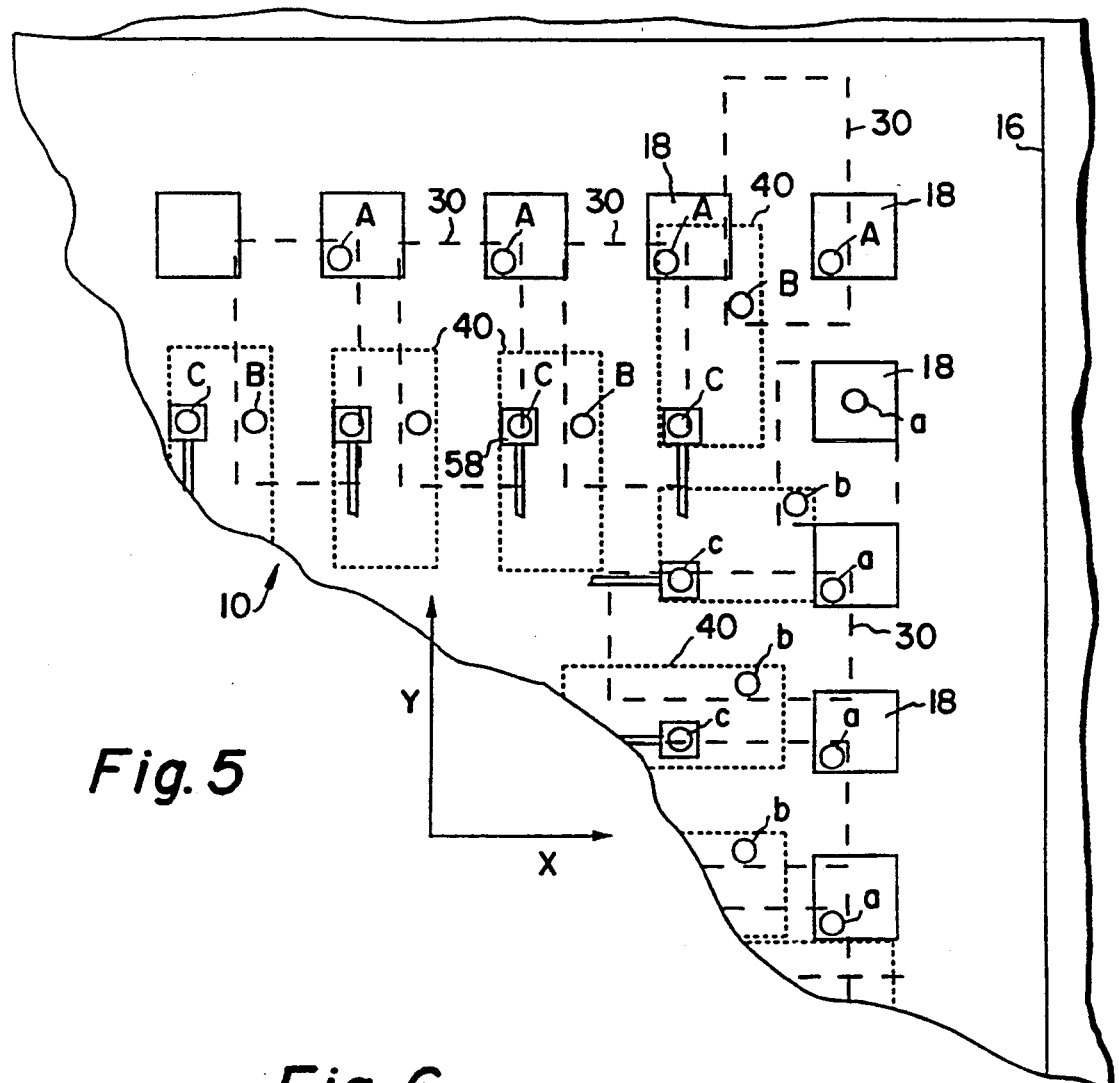
FIGS. 5 and 6 are similar views to FIGS. 1 and 2 illustrating the structure with the chip contact pads displaced the maximum distance from the signal conductor pattern which can be accommodated by two layers of rectangular alignment conductors with a reduced overlap of the contact pads.
Figure 6:
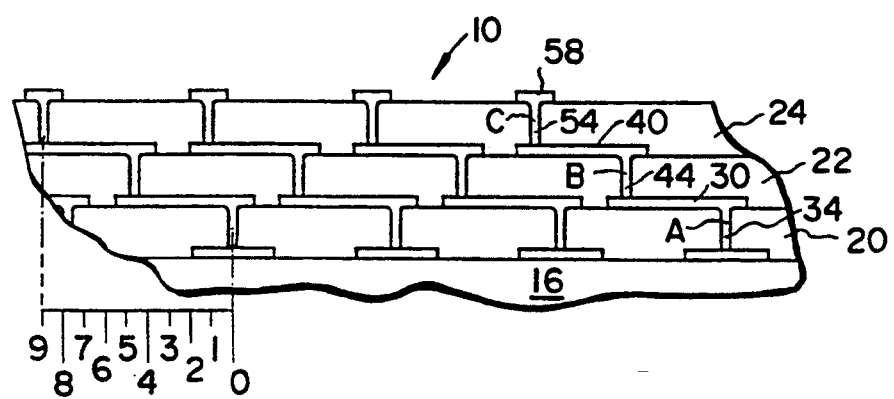

In FIGS. 5 and 6, a situation similar to that shown in FIGS. 3 and 4 is illustrated. However, in FIG. 5, the first level alignment conductors 30 are permitted to be shifted so that they have only 2 mil by 2 mil overlaps with the contact pads 18. Under these circumstances, as indicated by the scale at the lower right of FIG. 6, a misposition of ±9 mils can be handled.

In the vicinity of the corner of the chip, the repeating pattern of the alignment conductor positioning and the alignment conductors standard size are adjusted to provide a connection between each cover pad 58 and its associated contact pad 18 without introducing short circuits. For small misalignments, such variations in the alignment conductor pattern can be avoided. Alternatively, the pattern for the top corner contact pad 18 and the top corner cover pad 58 could be repeated for each of the other top contact pads.

Figure 7:
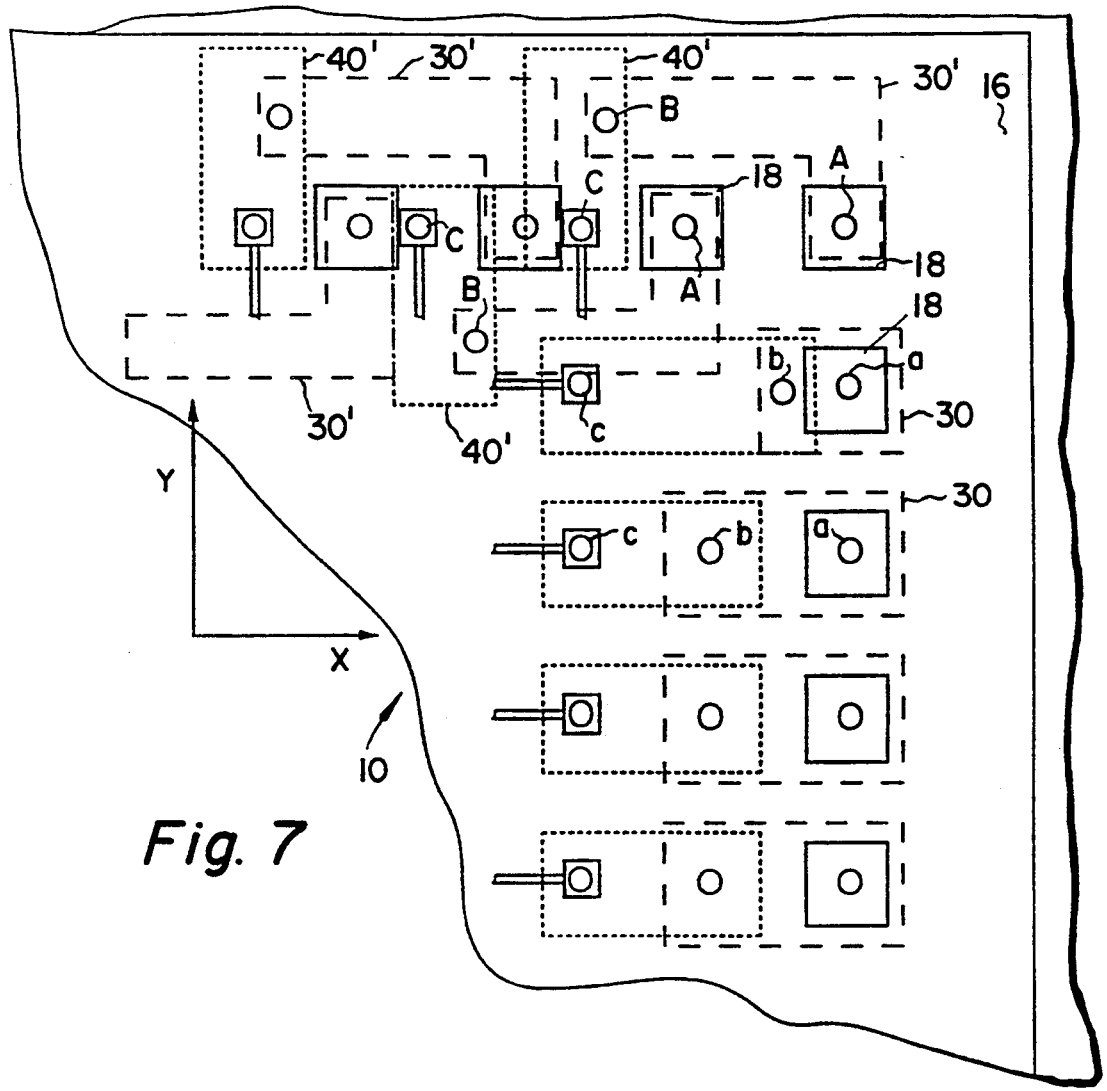
FIGS. 7 and 8 are similar views to FIGS. 1 and 2, but in which the chip contact pads are displaced from the signal conductor layer pattern in a manner which cannot be accommodated by two layers of rectangular alignment conductors, but in which connection can be provided by use of non-rectangular alignment conductors.
Figure 8:
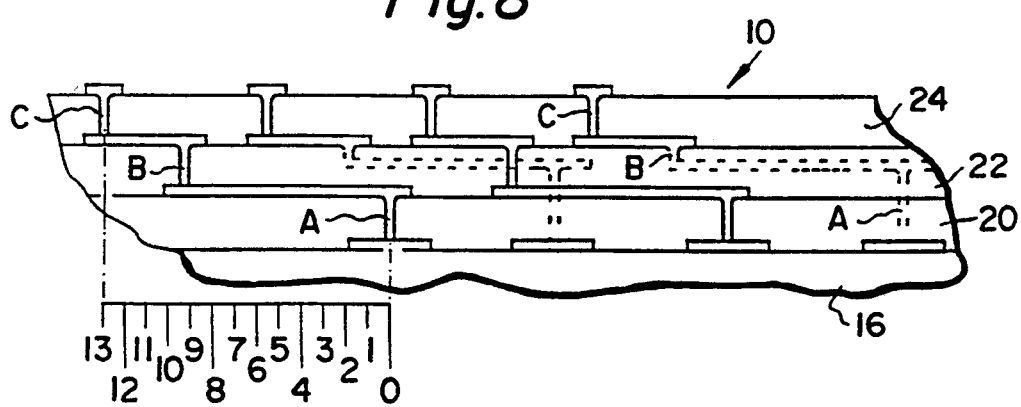

In FIGS. 7 and 8, a misposition is illustrated which cannot be handled with only two levels of rectangular alignment conductors. In this situation, the contact pads 18 are displaced +13 mils in the X-direction from the signal conductor cover pads 58. This places the contact pads where another contact pad 18 intervenes between the cover pad 58 and its associated contact pad 18 to which it must be connected. As illustrated in plan view in FIG. 7, L-shaped first level alignment conductors 30' are employed which alternate between being positioned toward the center of the chip from the top contact pads 18 and being positioned away from the center of the chip from the top contact pads 18. The rectangular second level alignment conductors 40' shown can then provide a connection between the cover pads 58 and their associated contact pads without introducing short circuits. In the cross-section illustration in FIG. 8, the first level alignment conductors 30, which are disposed outward from the contact pads, are illustrated in dashed lines and are elevated above the other first level alignment conductors in order to clearly illustrate the manner of the connection between the cover pads 58 and the contact pads 18.

Preferably, the first level metallization, which includes the first alignment conductors, serves as a ground plane in the high density interconnect structure and is substantially continuous except in the vicinity of the alignment conductors where a gap is left to isolate them from the ground plane. This continuous portion of the ground plane is not illustrated for the sake of drawing clarity. In a similar manner, the second layer of metallization in this structure is preferably a power plane which is substantially continuous except in the vicinity of the second level alignment conductors which, again, are spaced from the rest of the power plane to provide isolation. Preferably, both the portion of the first level metallization which is disposed within the area bounded by the contact pads of a single chip and the portion which is outside that boundary are connected together as much as possible in view of the design rules, the number and placement of contact pads on the chip and the number of ground or power contact pads on the chip, in order that each may be substantially continuous. This facilitates minimizing the voltage drop in the power and ground planes and thereby maximizes the speed at which the system can operate.

It will be observed in FIG. 7 that the L-shaped first level alignment conductors 30 effectively prevent the placing of a connection between the portion of that layer which is disposed over the center of the chip and the portion of that layer which is disposed outside the contact pads of the chip along the top of the chip except at isolated locations where a connection therebetween can be provided because one of the contact pads connects directly to that layer or because of a gap in the contact pad pattern or the presence of a contact pad which is not connected to the high density interconnect structure. This blockage is a result of the portion of an L-shaped alignment conductor disposed outside the contact pads overlapping the gap between two L-shaped alignment conductors disposed on the inside of the contact pads. This difficulty can be alleviated to some extent by the alternate configuration for the pads of FIGS. 7 and 8 which is illustrated in FIGS. 9 and 10.

Figure 9:
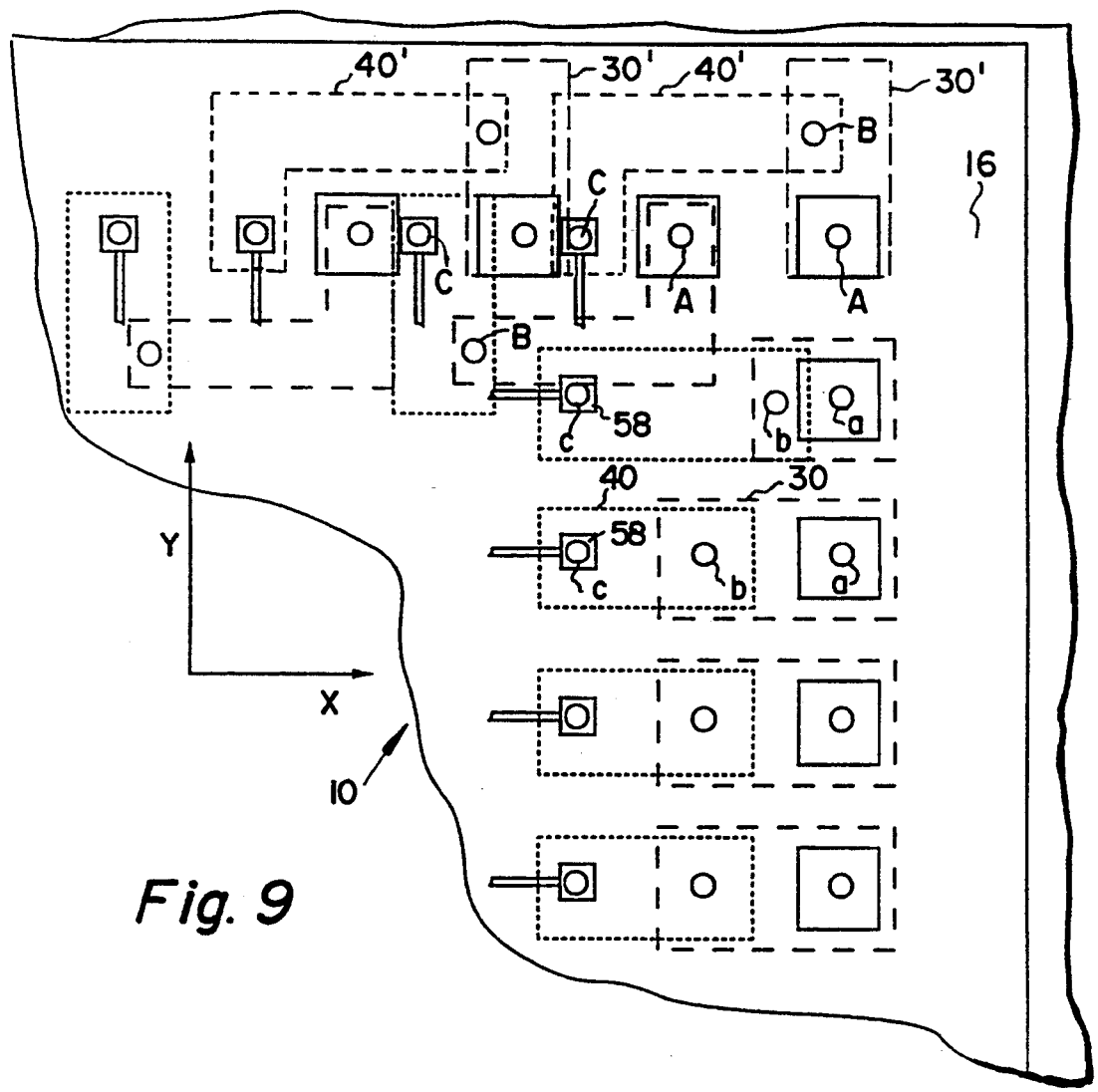
FIGS. 9 and 10 illustrate an alternative configuration of the alignment conductors for compensating for the misposition shown in FIGS. 7 and 8.
Figure 10:
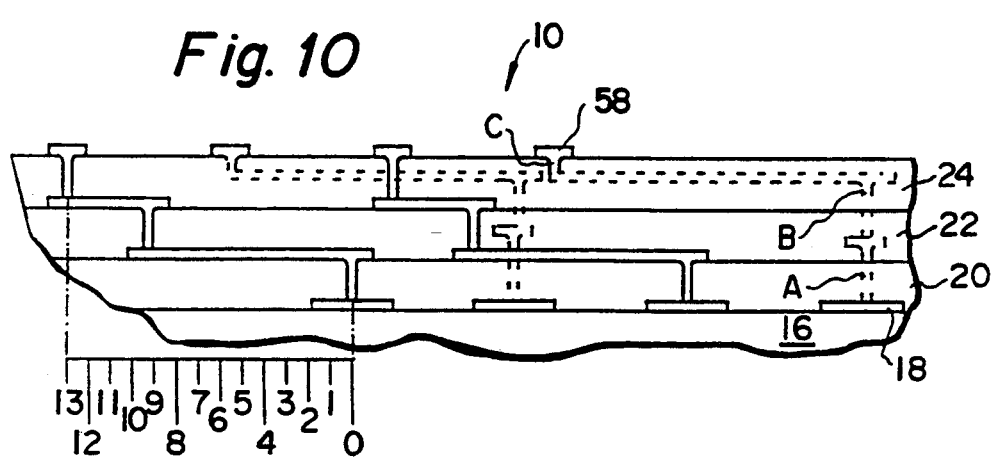

In FIG. 9, the connection path between each contact pad and the cover pad of its associated signal conductor has the same configuration in plan view as it does in FIG. 7. However, it will be noted that for the contact pads whose connection runs outside the chip contact pad pattern, it is the first level alignment conductor which is rectangular and it is the second level alignment conductor which is L-shaped. This has the effect of providing space for a straight-through conductor run in the gaps between adjacent L-shaped alignment conductors in each of the conductor levels. However, as has been noted, with present chip contact pad sizes and spacings and present chip placement tolerances, the use of such L-shaped alignment conductors should be unnecessary with the result that this solution to this problem is not expected to be needed except under rare conditions unless the size and center-to-center spacing of chip contact pads is significantly reduced.

The advantages of this invention of eliminating any need to adapt the pattern of the signal conductors are expected to be obtained at substantially no cost for high speed, complex systems because of a need to provide substantially continuous power and ground planes in the high density interconnect structure in order to avoid excessive voltage drops in the power and ground busses within the system and for shielding between the signal conductors and the chip.

Figure 11:
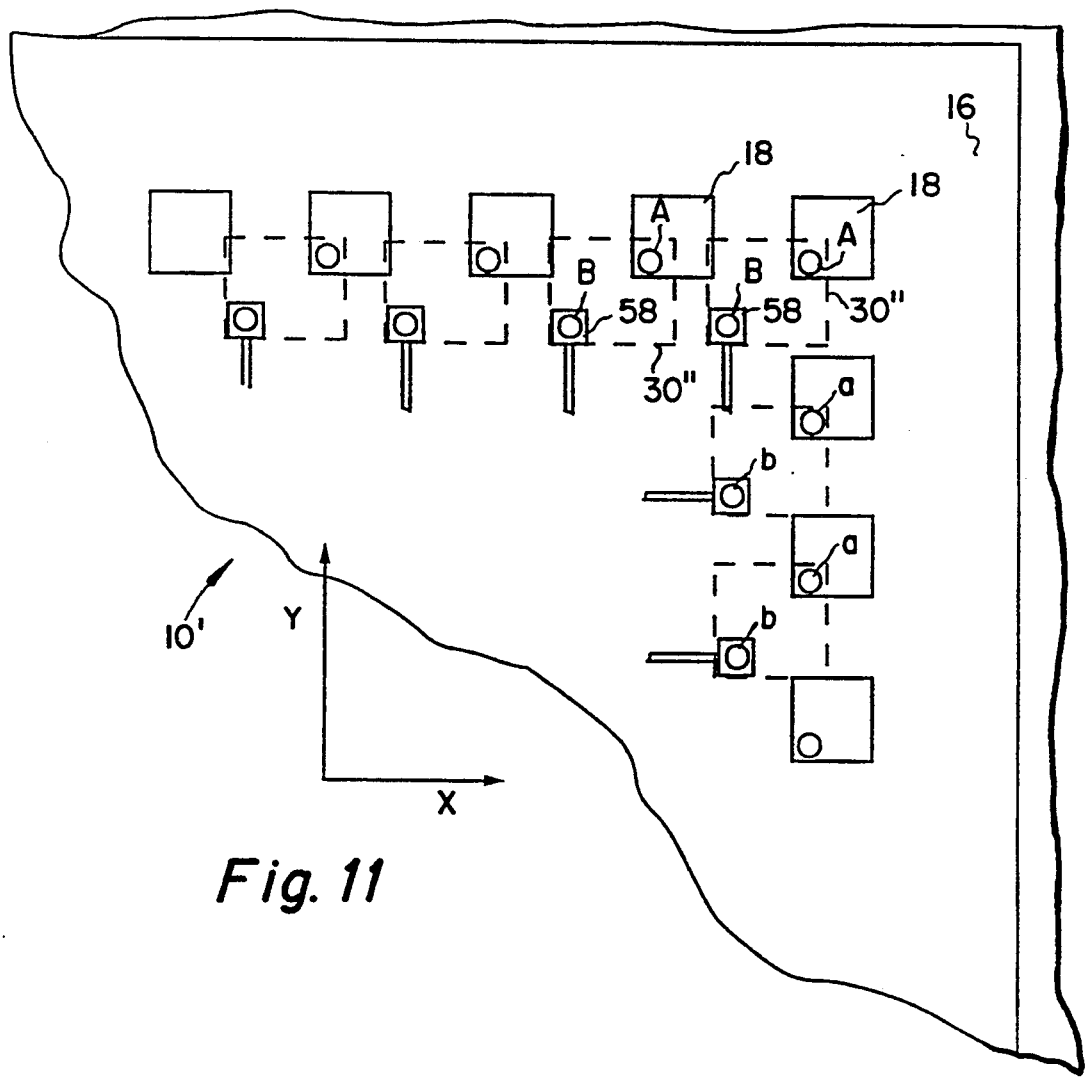
FIGS. 11 and 12 illustrate a structure employing a single level of alignment conductors which is capable of correcting for smaller mispositions than the two level alignment conductor system is.
Figure 12:
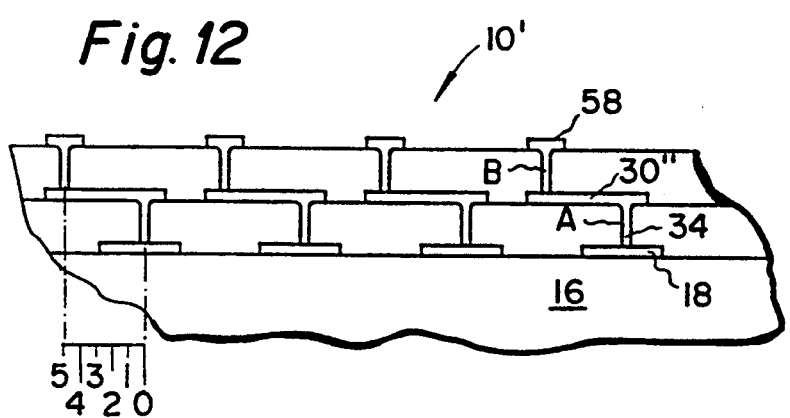

While the invention has been illustrated in terms of an embodiment employing alignment conductors in two different wiring levels of the high density interconnect structure, it should be understood that significant misalignment correction can be provided with alignment conductors which are restricted to a single layer of the high density interconnect structure. Such a structure is illustrated at 10' in FIGS. 11 and 12 in which 6 mils square alignment conductors 30" are employed in a system having 4 mils square chip pads disposed on 8 mils centers. In the illustrated embodiment, the alignment conductors are displaced relative to the contact pads so that only a 2×2 mils overlap is provided. Under those conditions, as illustrated by the scale at the lower right of FIG. 12, a misposition of up to 5 mils in either direction may be corrected in a single layer of alignment conductors. Where only a single layer of alignment conductors is employed, it is preferably a ground plane, as has been described above.

Related application Ser. No. 361,623, entitled, "Adaptive Lithography Accommodation of Tolerances in Chip Positioning in High Density Interconnect Structure" illustrates in its FIG. 10 a ground or power plane having the contact islands of that disclosure disposed in gaps in the ground plane. The structure illustrated in FIGS. 11 and 12 of the present application provides correction for substantially greater misposition than that structure because of its provision of the ability, in accordance with the present invention, to move the signal conductor and its via which connects it to the alignment conductor off-center on the alignment conductor, whereas in application Ser. No. 36,623, the contact island is shown centered on the signal conductor.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. In an electronic system of the type including a plurality of electronic components each including contact pads, a high density interconnect structure bonded to said components and including dielectric material and a pattern of conductors disposed on or in said dielectric material, the conductors of said high density interconnect structure electrically interconnecting said contact pads of said electronic components, the improvement comprising:

said pattern of conductors of said high density interconnect structure including a component alignment conductor layer and a signal conductor layer;

said dielectric material of said high density interconnect structure including a first layer of dielectric material bonded to said electronic components;

said component alignment conductor layer is a power or ground layer disposed on said first layer of dielectric material and including a plurality of alignment conductors, each of which overlaps an associated one of said contact pads, said first layer of dielectric material having a plurality of first via holes therein, each of said first via holes being disposed within the overlap between one of said contact pads and its associated alignment conductor;

each of said alignment conductors extending into ohmic contact with its associated contact pad in the one of said first via holes which is disposed in their overlap;

said dielectric material of said high density interconnect structure including a second layer of dielectric material disposed over said component alignment conductor layer and exposed portions of said first layer of dielectric material;

said signal conductor layer being disposed on said second layer of dielectric material and including conductive runs and a plurality of signal conductor cover pads each associated with a particular one of said contact pads;

said second layer of dielectric material having a plurality of second via holes therein, each of said second via holes being disposed in an overlap between one of said alignment conductors and an associated one of said signal conductor cover pads which extends into ohmic contact with that alignment conductor in that second via hole;

an alignment conductor and its associated contact pad and its associated signal conductor cover pad comprising an associated set in which the contact pad is connected to its associated signal conductor cover pad by the alignment conductor; and in at least one of said associated sets, said signal conductor cover pad is not aligned over a center line of the alignment conductor.

2. In an electronic system of the type including a plurality of electronic components each including contact pads, a high density interconnect structure bonded to said components and including dielectric material and a pattern of conductors disposed on or in said dielectric material, the conductors of said high density interconnect structure electrically interconnecting said contact pads of said electronic components, the improvement comprising:

said pattern of conductors of said high density interconnect structure including first and second component alignment conductor layers, where one of said first and second alignment conductor layers is a ground plane layer, and a signal conductor layer;

said dielectric material of said high density interconnect structure including a first layer of dielectric material bonded to said electronic components;

said first alignment conductor layer being disposed on said first layer of dielectric material and including a plurality of first alignment conductors each of which overlaps an associated one of said contact pads, said first layer of dielectric material having a plurality of first via holes therein, each of said first via holes being disposed within the overlap between one of said contact pads and its associated first alignment conductor;

each of said first alignment conductors extending into ohmic contact with its associated contact pad in that one of said first via holes which is disposed in their overlap;

said dielectric material of said high density interconnect structure including a second layer of dielectric material disposed over said first alignment conductor layer and exposed portions of said first layer of dielectric material;

said second alignment conductor layer being disposed on said second layer of dielectric material and including a plurality of second alignment conductors each of which is associated with and at least partially overlaps one of said first alignment conductors, said second layer of dielectric material having a plurality of second via holes therein each of said second via holes being disposed within the overlap between one of said first alignment conductors and its associated second alignment conductor, each of said second alignment conductors extending into the second via hole disposed in its overlap with its associated first alignment conductor and into ohmic contact with said associated first alignment conductor;

said dielectric material of said high density interconnect structure including a third layer of dielectric material disposed over said second alignment conductor layer and exposed portions of said second layer of dielectric material;

said signal conductor layer being disposed on said third layer of dielectric material and including conductive runs and a plurality of signal conductor cover pads each associated with a particular one of said contact pads;

each of said second alignment conductors being associated with a signal conductor cover pad;

said third layer of dielectric material having third via holes therein, each of said third via holes being disposed in alignment with one of said signal conductor cover pads where it overlaps an associated one of said second alignment conductors, that signal conductor cover pad extending into that third via hole and into ohmic contact with that associated second alignment conductor, whereby a contact pad, a first alignment conductor, and second alignment conductor and its associated signal conductor cover pad comprise an associated set in which the contact pad is connected to its associated signal conductor cover pad by the alignment conductors; and in at least one associated set the signal conductor cover pad is misaligned with respect to the contact pad.

3. The improvement recited in claim 2 wherein:

the other of said first and second alignment conductor layers is a power plane layer.

* * * * *